(12) United States Patent
Satoh et al.

(10) Patent No.: US 8,575,584 B2
(45) Date of Patent: Nov. 5, 2013

(54) RESISTIVE MEMORY DEVICE HAVING VERTICAL TRANSISTORS AND METHOD FOR MAKING THE SAME

(75) Inventors: Kimihiro Satoh, Beaverton, OR (US);
Yiming Huai, Pleasanton, CA (US);
Jing Zhang, Los Altos, CA (US)

(73) Assignee: Avalanche Technology Inc., Fremont, CA (US)

( * ) Notice: Subject to any disclaimer, the term of this patent is extended or adjusted under 35 U.S.C. 154(b) by 101 days.

(21) Appl. No.: 13/225,431

(22) Filed: Sep. 3, 2011

(65) Prior Publication Data
US 2013/0056698 A1    Mar. 7, 2013

(51) Int. Cl.
*H01L 29/02*    (2006.01)

(52) U.S. Cl.
USPC ............................................. 257/2; 365/148

(58) Field of Classification Search
USPC ............................................. 257/2; 365/148
See application file for complete search history.

(56) References Cited

U.S. PATENT DOCUMENTS

| | | | |
|---|---|---|---|
| 4,670,768 A | 6/1987 | Sunami et al. | |
| 4,937,641 A | 6/1990 | Sunami et al. | |
| 5,302,843 A | 4/1994 | Yamazaki | |
| 5,350,934 A | 9/1994 | Matsuda et al. | |
| 5,466,961 A | 11/1995 | Kikuchi et al. | |
| 7,157,771 B2 | 1/2007 | Forbes | |
| 7,205,604 B2 | 4/2007 | Ouyang et al. | |
| 7,348,628 B2 | 3/2008 | Yoon et al. | |
| 7,504,298 B2 | 3/2009 | Manning et al. | |
| 7,742,438 B1 | 6/2010 | Chen et al. | |
| 7,781,287 B2 | 8/2010 | Yoon et al. | |
| 7,786,522 B2 | 8/2010 | Manning et al. | |
| 7,851,851 B2 | 12/2010 | Mokhlesi et al. | |
| 7,898,006 B2 | 3/2011 | Gruening-von Schwerin | |
| 7,910,914 B2 | 3/2011 | Tanaka et al. | |
| 2003/0001203 A1 | 1/2003 | Ono et al. | |
| 2003/0186506 A1 | 10/2003 | Huang | |
| 2006/0097304 A1* | 5/2006 | Yoon et al. | 257/307 |
| 2008/0209118 A1* | 8/2008 | Kajiyama | 711/105 |
| 2010/0059837 A1 | 3/2010 | Kim et al. | |
| 2010/0219392 A1* | 9/2010 | Awaya et al. | 257/3 |
| 2010/0244897 A1 | 9/2010 | Saito et al. | |
| 2011/0068418 A1* | 3/2011 | Lung | 257/413 |
| 2011/0215396 A1* | 9/2011 | Tang et al. | 257/329 |

* cited by examiner

*Primary Examiner* — David Vu
*Assistant Examiner* — Brandon Fox
(74) *Attorney, Agent, or Firm* — Bing K. Yan; G. Marlin Knight

(57) ABSTRACT

The present invention relates to resistive memory devices incorporating therein vertical selection transistors and methods for making the same. A resistive memory device comprises a semiconductor substrate having a first type conductivity; a plurality of vertical selection transistors formed on the semiconductor substrate in an array, each of the plurality of vertical selection transistors including a semiconductor pillar protruded from the semiconductor substrate, top region of the semiconductor pillar having a second type conductivity opposite to the first type conductivity provided in the semiconductor substrate; and a gate electrode surrounding the semiconductor pillar with a gate dielectric layer interposed therebetween, the gate electrode being lower in height than the semiconductor pillar; a plurality of contact studs disposed on top of the vertical selection transistors; a plurality of resistive memory elements disposed on top of the contact studs; a plurality of parallel word lines connecting the vertical selection transistors by way of respective gate electrodes, the parallel word lines extending along a first direction; a plurality of parallel bit lines connecting the resistive memory elements, the parallel bit lines extending along a second direction different from the first direction provided in the parallel word lines; and a plurality of parallel source lines with the second type conductivity formed in top regions of the semiconductor substrate in between rows of the semiconductor pillars, wherein the source lines and the top regions of the semiconductor pillars function as source and drain, respectively.

23 Claims, 16 Drawing Sheets

RESISTIVE MEMORY DEVICE HAVING VERTICAL TRANSISTORS AND METHOD FOR MAKING THE SAME

FIELD OF THE INVENTION

The present invention relates to resistive memory devices having an array of vertical selection transistors and method for making the same.

BACKGROUND OF THE INVENTION

Resistive memory is a new class of non-volatile memory, which can retain the stored information when powered off. A resistive memory device normally comprises an array of memory cells, each of which includes at least a resistive memory element and a selection element coupled in series between appropriate electrodes. Upon application of an appropriate voltage or current to the resistive memory element, the electrical resistance of the resistive memory element would change accordingly, thereby switching the stored logic in the respective memory cell.

A resistive memory element can be classified into at least one of several known groups based on its resistively switching mechanism. The resistive memory element of Phase Change Random Access Memory (PCRAM) may comprise a phase change chalcogenide compound, which can switch between a resistive amorphous phase and a conductive crystalline phase. The resistive memory element of Conductive Bridging Random Access Memory (CBRAM) relies on the statistical bridging of metal rich precipitates therein for its switching mechanism. The resistive memory element of CBRAM normally comprises a nominally insulating metal oxide material, which can switch to a lower electrical resistance state as the metal rich precipitates grow and link to form conductive paths upon application of an appropriate voltage. The resistive memory element of Magnetoresistive Random Access Memory (MRAM) typically comprises at least two layers of different ferromagnetic materials with a non-magnetic spacer layer interposed therebetween. When a switching pulse is applied to the memory element of a MRAM device, one of the ferromagnetic layers will switch its magnetic field polarity, thereby changing the element's electrical resistance.

A selection element in a memory cell functions like a switch to direct current through the selected memory element coupled thereto. One common selection element is diode, which can reverse bias a non-selected memory cell. While a selection diode has a simple structure that can minimize the cell size of the resistive memory cell, a memory architecture employing the selection diode normally has a slower random access time. Another commonly used selection element is transistor, which allows for faster selection of memory cells and therefore faster random access time. While a memory device employing the selection transistor is more suitable for the random access type of memories, the more complicated structure of the selection transistor means the size of the memory cell will be larger, which translates to a lower cell density.

FIG. 1 is a perspective view of a conventional resistive memory device comprising a silicon substrate 80, a plurality of memory cells 82 formed thereon, a plurality of parallel gate electrodes 84 connecting the cells 82 in a first direction, a plurality of parallel source lines 86 connecting the cells 82 in the first direction, and a plurality of bit lines 88 connecting the cells 82 in a second direction substantially perpendicular to the first direction. Each of the memory cells 82 includes a resistive memory element 90 and a conventional selection transistors 92 connected in series by way of a contact 94. The channel of each of the selection transistor 92 beneath the gate has a length of 1F and a width of 1F, where F denotes the minimum feature size or one half the minimum feature pitch normally associated with a particular lithography process. In memory applications where memory cells are arranged in dense and repetitive patterns, photolithography is more constrained by the pitch of the feature pattern rather than the feature size itself. This is because the feature size can be modulated by photo lithography process conditions, such as exposure and resist development, but shrinkage of the feature pitch would require shorter wavelength light source and/or significant improvement in optics. In reality, the scaling of the device size in a dense array, such as that in memory applications, is limited by the minimum feature pitch of 2F. Moreover, it is normally assumed that the minimum feature size is half of the corresponding minimum pitch. The illustrated conventional resistive memory device in FIG. 1 has cell dimensions of 4F and 2F in the directions of bit lines 88 and source lines 86, respectively, resulting in a cell size of $8F^2$. As would be understood by one of ordinary skill in the art, the minimum pitch between two repetitive features on a same mask layer is 2F. Accordingly, the minimum size of a memory cell would be $4F^2$ when arranged in a square array using conventional lithography.

To be cost competitive, a small memory cell size is desired in order to increase device density. One way to achieve this is to simply shrink the feature size, F. However, several difficulties can arise when scaling the size of the conventional transistors 92 illustrated in FIG. 1, particularly its channel length, to sizes of a few tens of nanometers. As the channel length is reduced, there is a propensity for the formation of parasitic conduction paths between source and drain, thereby causing punch through current leakages. Another obstacle encountered in shrinking the conventional transistors 92 is reduced current drivability caused by the reduced width of the current carrying channel. This is a significant issue for resistive memory devices, which require higher current to switch their memory state.

Another way to reduce the memory cell size is to use a different architecture that would permit the memory cell size to scale down to the minimum size of $4F^2$ while increasing the channel width and length to mitigate the above mentioned problems associated with shrinking feature sizes. With the source, drain, and channel of the selection transistor lie on a same plane, the conventional resistive memory cell size as illustrated in FIG. 1 is limited to $8F^2$. Moreover, the corresponding channel width and length of the conventional selection transistor would both be 1F.

SUMMARY OF THE INVENTION

The present invention overcomes the current drivability and punch through current leakage issues associated with the conventional selection transistor while reducing the resistive memory cell size to $4F^2$ by using a novel cell design that includes an array of vertical selection transistors.

Accordingly, an object of the present invention is to provide a novel resistive memory device having an array of vertical selection transistors and a network of conductive lines for connection therebetween.

Another object of the present invention is to provide a method for making the novel resistive memory device having an array of vertical selection transistors and a network of conductive lines for connection therebetween.

Therefore, according to one aspect of the present invention, a resistive memory device comprises a semiconductor substrate having a first type conductivity; a plurality of vertical selection transistors formed on the semiconductor substrate in an array, each of the plurality of vertical selection transistors including: a semiconductor pillar protruded from the semiconductor substrate, top region of the semiconductor pillar having a second type conductivity opposite to the first type conductivity provided in the semiconductor substrate; and a gate electrode surrounding the semiconductor pillar with a gate dielectric layer interposed therebetween, the gate electrode being lower in height than the semiconductor pillar; a plurality of contact studs disposed on top of the vertical selection transistors; a plurality of resistive memory elements disposed on top of the contact studs; a plurality of parallel word lines connecting the vertical selection transistors by way of respective gate electrodes, the parallel word lines extending along a first direction; a plurality of parallel bit lines connecting the resistive memory elements, the parallel bit lines extending along a second direction different from the first direction provided in the parallel word lines; and a plurality of parallel source lines with the second type conductivity formed in top regions of the semiconductor substrate in between rows of the semiconductor pillars, wherein the source lines and the top regions of the semiconductor pillars function as source and drain, respectively.

According to another aspect of the present invention, a method for fabricating a resistive memory device comprises the steps of providing a semiconductor substrate having a first type conductivity; forming a plurality of semiconductor pillars on the substrate with top regions of the pillars having a second type conductivity opposite to the first type conductivity; forming a gate dielectric layer around peripheries of the semiconductor pillars; forming a plurality of gate electrodes around the semiconductor pillars with the gate dielectric layer interposed therebetween and a plurality of parallel word lines connecting the gate electrodes by dry etching a self-aligned monolithic film structure, the gate electrodes being lower in height than the semiconductor pillars; forming a plurality of parallel source lines in top regions of the substrate in between the word lines by ion implantation, the source lines having the second type conductivity; forming a plurality of self-aligned contact studs on the semiconductor pillars; forming a plurality of resistive memory elements on the contact studs; and forming a plurality of parallel bit lines connecting rows of the resistive memory elements.

The objects, features, aspects, and advantages of the present invention are readily apparent from the following detailed description of the preferred embodiments for carrying out the invention when taken in connection with the accompanying drawings.

BRIEF DESCRIPTION OF THE DRAWINGS

For purposes of clarity and brevity, like elements and components will bear the same designations and numbering throughout the Figures, which are not necessarily drawn to scale.

DETAILED DESCRIPTION OF THE INVENTION

Figure 1:
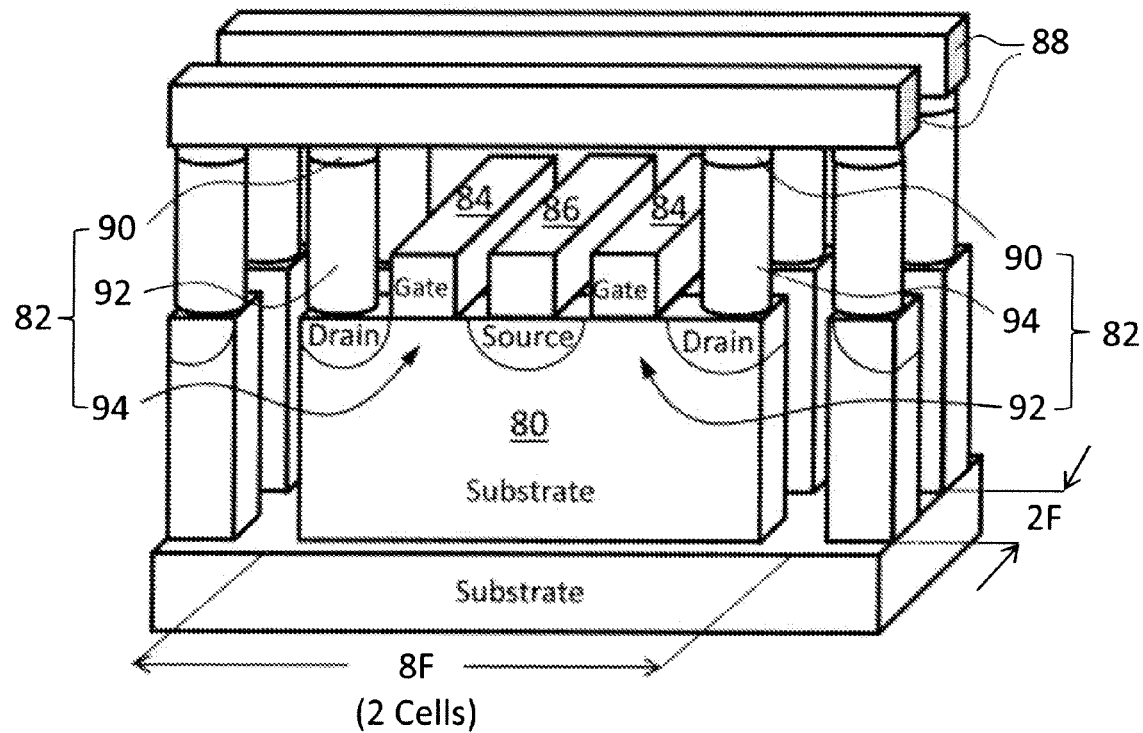
FIG. 1 is a perspective view illustrating a conventional resistive memory device with conventional selection transistors.

The present invention overcomes the current drivability and punch through current leakage issues associated with the conventional selection transistor as the feature size shrinks Moreover, the present invention also reduces the resistive memory cell size to $4F^2$ by using a novel cell design that includes a vertical selection transistor, which has a conductive channel oriented perpendicularly to a substrate therebeneath.

An embodiment of the present invention as applied to a resistive memory device having an array of memory cells will now be described with reference to FIG. 2. In this drawing, the insulation material separating various elements is omitted for reasons of clarity. The illustrated memory device 100 comprises a semiconductor substrate 102 having a p-type conductivity; a plurality of memory cells 104 formed on the semiconductor substrate 102 in an array, each of the memory cells 104 includes a vertical selection transistor 106, a resistive memory element 108, and a contact stud 110 interposed therebetween; a plurality of parallel word lines 112 formed on a gate dielectric layer 114 on the substrate 102 connecting rows of the vertical selection transistors 106 in a first direction; a plurality of parallel bit lines 116 connecting rows of the resistive memory elements 108 in a second direction, different from the first direction; and a plurality of source lines 118 with a n-type conductivity formed in top regions of the semiconductor substrate 102 in between the parallel word lines 112.

The substrate 102 can be any semiconductor substrate known in the art, such as silicon (Si), silicon germanium (SiGe), silicon carbide (SiC), SiCGe, II-VI compounds, III-V compounds, or semiconducting epitaxial layers over such substrates. According to one embodiment of the present invention, the substrate 102 is formed of silicon to provide a base for the formation of the vertical selection transistors 106.

Figure 2:
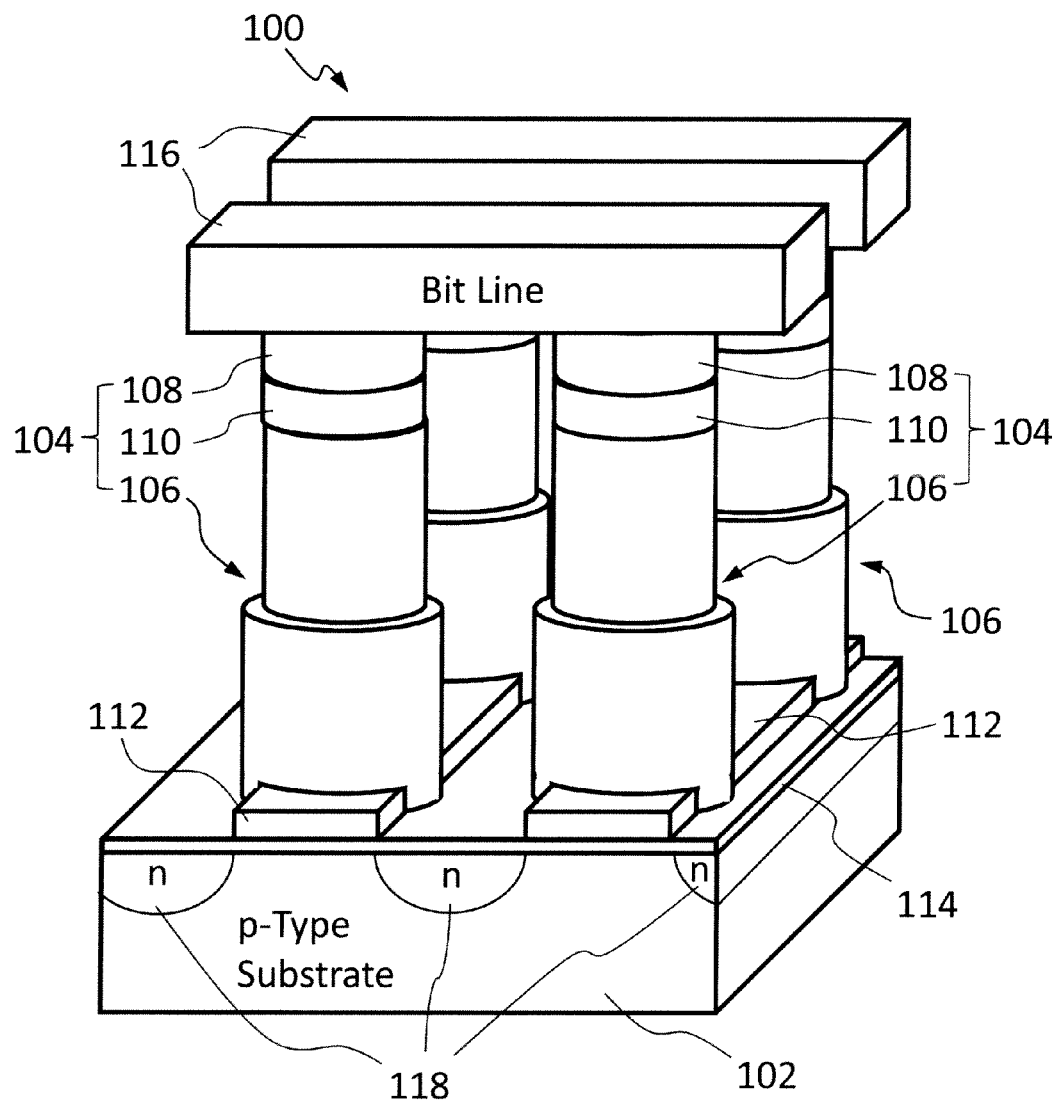
FIG. 2 is a perspective view of the present invention as applied to a resistive memory device having a plurality of memory cells, each of which including a resistive memory element and a vertical selection transistor.
Figure 3A:
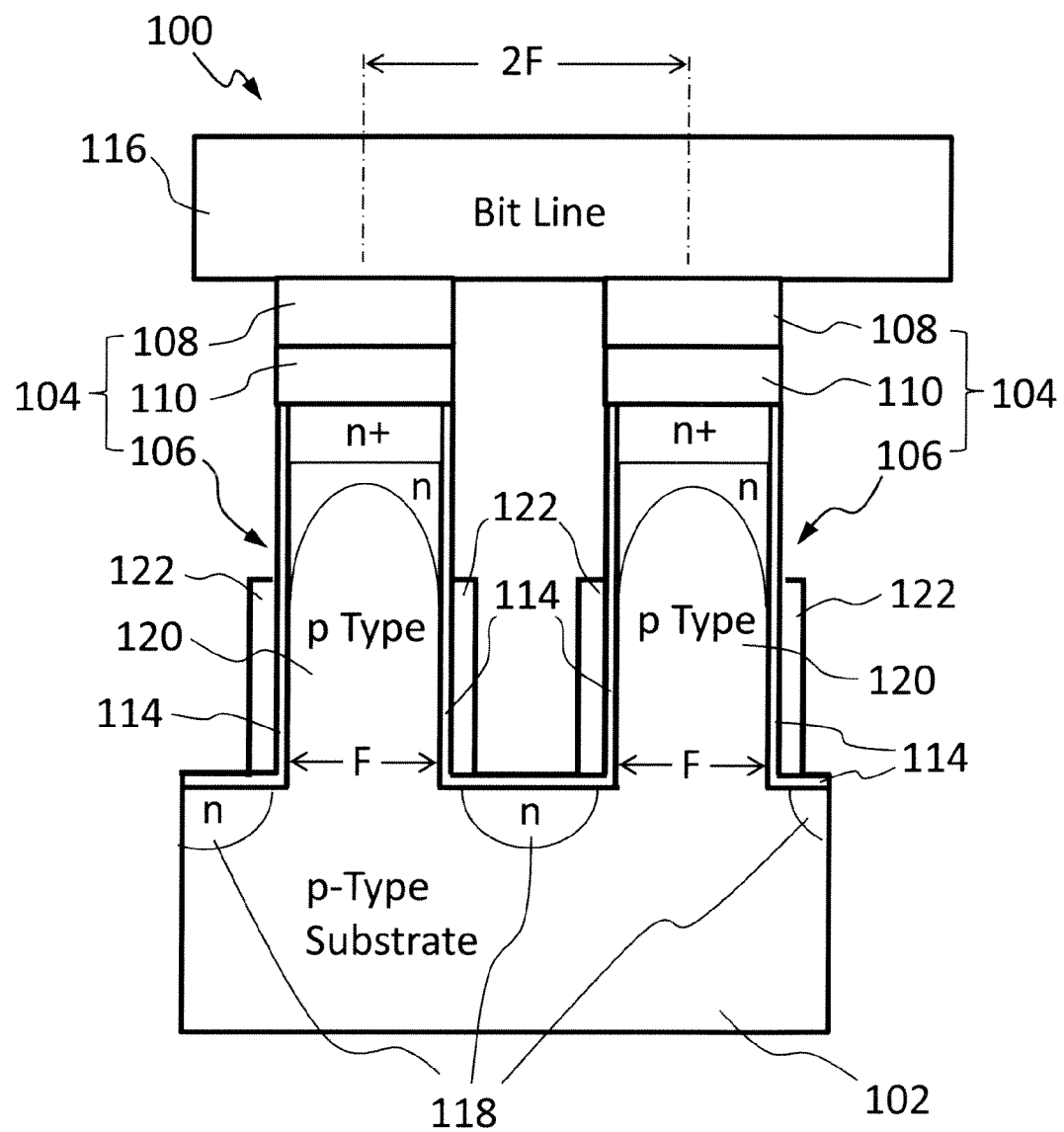
FIGS. 3A and 3B are cross sectional views of a resistive memory device according to embodiments of the present invention along the source line direction and bit line direction, respectively.
Figure 3B:
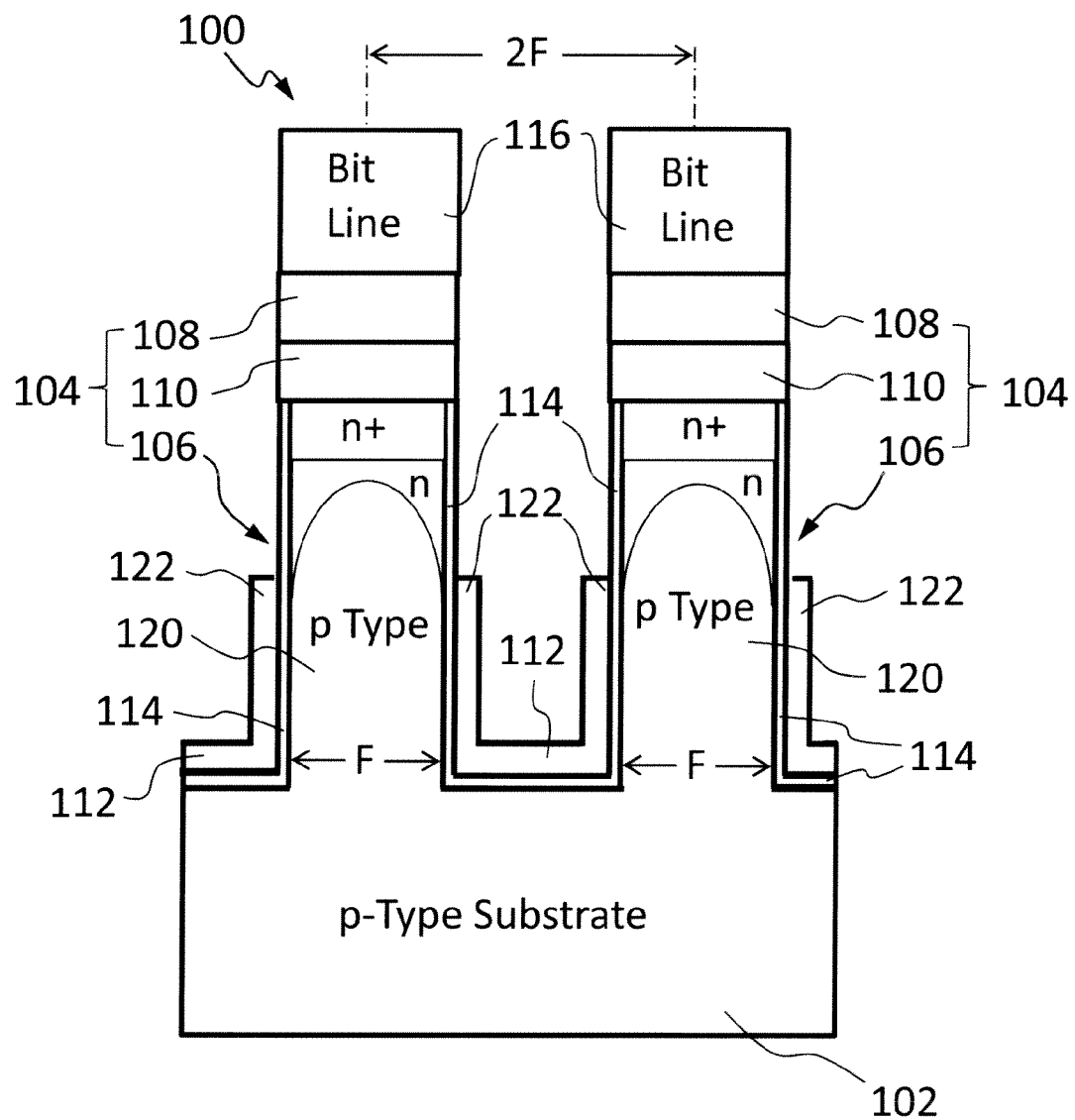

FIGS. 3A and 3B are schematic cross sectional views of the memory device 100 in FIG. 2 along the source line and bit line directions, respectively. In the drawings, numerals 100 to 118 denote the same components as those shown in FIG. 2. Each of the memory cells 104 includes a resistive memory element 108, a contact stud 110, and a vertical selection transistor 106, which further comprises a semiconductor pillar 120 protruded from the substrate 102 and a gate electrode 122 surrounding the semiconductor pillar 120 with the gate dielectric layer 114 interposed therebetween.

With continuing reference to FIG. 3A, the semiconductor pillars 120 may be formed by etching into the substrate 102. Regions of the semiconductor pillars 120 surrounded by the gate electrodes 122 have the same p-type conductivity as that of the substrate 102. Top regions of the semiconductor pillars 120 not surrounded by the gate electrodes 122 have a n-type conductivity and function as drain. In some embodiments, the top of the drain regions adjacent to the contact studs 110 may be heavily doped (i.e. n+) to reduce electrical resistance. The n and n+conductivities of the drain regions may be created by diffusion, ion implantation, or a combination thereof. The source lines 118 formed in the top regions of the substrate 102 in between rows of semiconductor pillars 120 function as common source for adjacent transistors 106. As such, current flows vertically between source and drain. The source lines 118 with the n-type conductivity may be formed by ion implantation into the substrate 102 with any suitable dopant, such as phosphorous, arsenic, or antimony. When an appropriate voltage is applied to the gate electrodes 122, charge carriers move vertically between the source lines 118 and the drain regions on top of the pillars 120 through conductive channels formed in pillar surface regions surrounded by the gate electrodes 122. The vertical conductive channels are formed by electric fields generated by the gate voltage through the gate dielectric layer 114 interposed in between the gate electrodes 122 and the semiconductor pillars 120.

Referring now to FIG. 3B, the gate dielectric layer 114 lining the top surface of the substrate 102 and outer peripheries of the semiconductor pillars 120 also functions as an insulator to electrically isolate the word lines 112 from the substrate 102 therebeneath. The gate dielectric layer 114 preferably has a thickness of between 0.5-7 nm and may comprise any material with sufficiently high dielectric constant, including but not limited to silicon oxide ($SiO_x$), silicon oxynitride ($SiO_xN_y$), hafnium oxide ($HfO_x$), hafnium oxynitride ($HfO_xN_y$), hafnium silicate ($HfSiO_x$), $HfSiO_xN_y$, zirconium oxide ($ZrO_x$), zirconium oxynitride ($ZrO_xN_y$), zirconium silicate ($ZrSiO_x$), $ZrSiO_xN_y$, aluminum oxide ($AlO_x$), or combinations thereof. The gate dielectric layer 114 may be formed by thermal oxidation of top surface of the substrate 102 and the outer peripheries of the semiconductor pillars 120 or by any suitable thin film deposition method, such as Chemical Vapor Deposition (CVD) or Atomic Layer Deposition (ALD). In some embodiments where the substrate 102 and the pillars 120 are formed of silicon, the gate dielectric layer 114 is preferably silicon oxide formed by thermal oxidation. In another embodiment, the gate dielectric layer 114 is formed of a compound comprising hafnium and oxygen, such as $HfO_x$ or $HfSiO_x$.

With continuing reference to FIG. 3B, the gate electrodes 122 surround the semiconductor pillars 120 from the pillar base to a height which is less than the pillar height. The electrode height essentially defines the channel length and can be greater than 2F for a pillar width or diameter of F. Accordingly, the vertical selection transistors 106 can have a channel length of greater than 2F compared with the fixed channel length of F for conventional planar transistors. The gate electrodes 122 may comprise one or more layers of any suitable conductive material, such as doped polysilicon, tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), or combinations thereof. The gate electrodes 122 may be formed by first depositing one or more layers of conductors around the pillars 120 using a conformal thin film deposition method, such as Chemical Vapor Deposition (CVD) or Atomic Layer Deposition (ALD), and followed by Reactive Ion Etching (RIE) to define the electrode height. In an embodiment, the gate electrodes 122 comprise doped polysilicon. In another embodiment, the gate electrodes 122 comprise at least one layer formed of $TiN_x$. The conductive film forming the gate electrodes 122 also extends horizontally on the substrate 102 and connects rows of individual gate electrodes 122 to form the word lines 112. Accordingly, each of the word lines 112 and the gate electrodes 122 connected thereto have a monolithic film structure, which lies on the substrate 102 in between the pillars 120 and extends upward to surround the pillars 120 protruded from the substrate 102.

It should be noted that while the individual vertical selection transistors 106 can be arranged on the substrate 102 with a minimum pitch of 2F in the bit line and source line directions, in a memory device where multiple wiring lines pass through each memory cell and its transistor, the design and placement of word lines connecting the transistors are critical in preserving the minimum memory cell size. The present approach of forming the gate electrodes 122 and word lines 112 from a monolithic film structure by a self aligned process enables the memory cells 104 to retain a minimum pitch of 2F along the bit line and source line directions, resulting in a minimum cell size of $4F^2$.

The function of the contact studs 110 is to provide Ohmic contact for the drain regions of the vertical selection transistors 106, thereby decreasing the contact resistance. The contact studs 110 may comprise one or more layers of any suitable conductive material, such as tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), titanium (Ti), palladium (Pd), platinum silicide (PtSi), Indium (In), or combinations thereof.

The resistive memory elements 108 may switch their resistance state by any suitable switching mechanism, such as phase change, precipitate bridging, magnetoresistive switching, or combinations thereof. In one embodiment, the resistive memory elements 108 comprise a phase change chalcogenide compound, such as $Ge_2Sb_2Te_5$ or AgInSbTe, which can switch between a resistive amorphous phase and a conductive crystalline phase. In another embodiment, the resistive memory elements 108 comprise a nominally insulating metal oxide material, such as NiO, $TiO_2$, or $Sr(Zr)TiO_3$, which can switch to a lower electrical resistance state as the metal rich precipitates grow and link to form conductive paths upon application of an appropriate voltage. In yet another embodiment, the resistive memory elements 108 comprise at least two layers of ferromagnetic materials with a non-magnetic spacer layer interposed therebetween. When a switching pulse is applied, one of the ferromagnetic layers will switch its magnetic field polarity, thereby changing the element's electrical resistance.

The bit lines 116 connect rows of memory cells 104 by way of their respective memory elements 108. The bit lines 116 may comprise any suitable conductive material, such as copper (Cu), tungsten (W), aluminum (Al), silver (Ag), or alloys thereof. The bit lines 116 may be formed by PVD or CVD of the conductive material and then followed by photolithography and dry etch to define the line pattern.

In a preferred embodiment, the memory cells 104 of the memory device 100 illustrated in FIGS. 3A and 3B are arranged in a square array and are equally spaced apart along the bit line direction and source line direction with a pitch of 2F, thereby reducing the cell size to the minimum size of $4F^2$. The nominal width of the semiconductor pillars 120 is 1F, which would translate to a channel width of 3.14F for a nominally cylindrical pillar shape. The vertical channel length of the vertical selection transistors 106 is determined by the height of the gate electrodes 122, which may be 2F or more. Despite having a smaller cell size compared with the conventional resistive memory device with a $8F^2$ cell size, the memory device 100 has a wider and longer channel than the conventional device to mitigate the short channel and current drivability issues associated with scaling down. Compared with the conventional planar channel transistor, the conductive channels of the vertical selection transistors 106 may be fully depleted at a lower voltage and the source/drain voltage differential is also lower, thereby enabling the memory device 100 to operate at a lower power.

Figure 4:
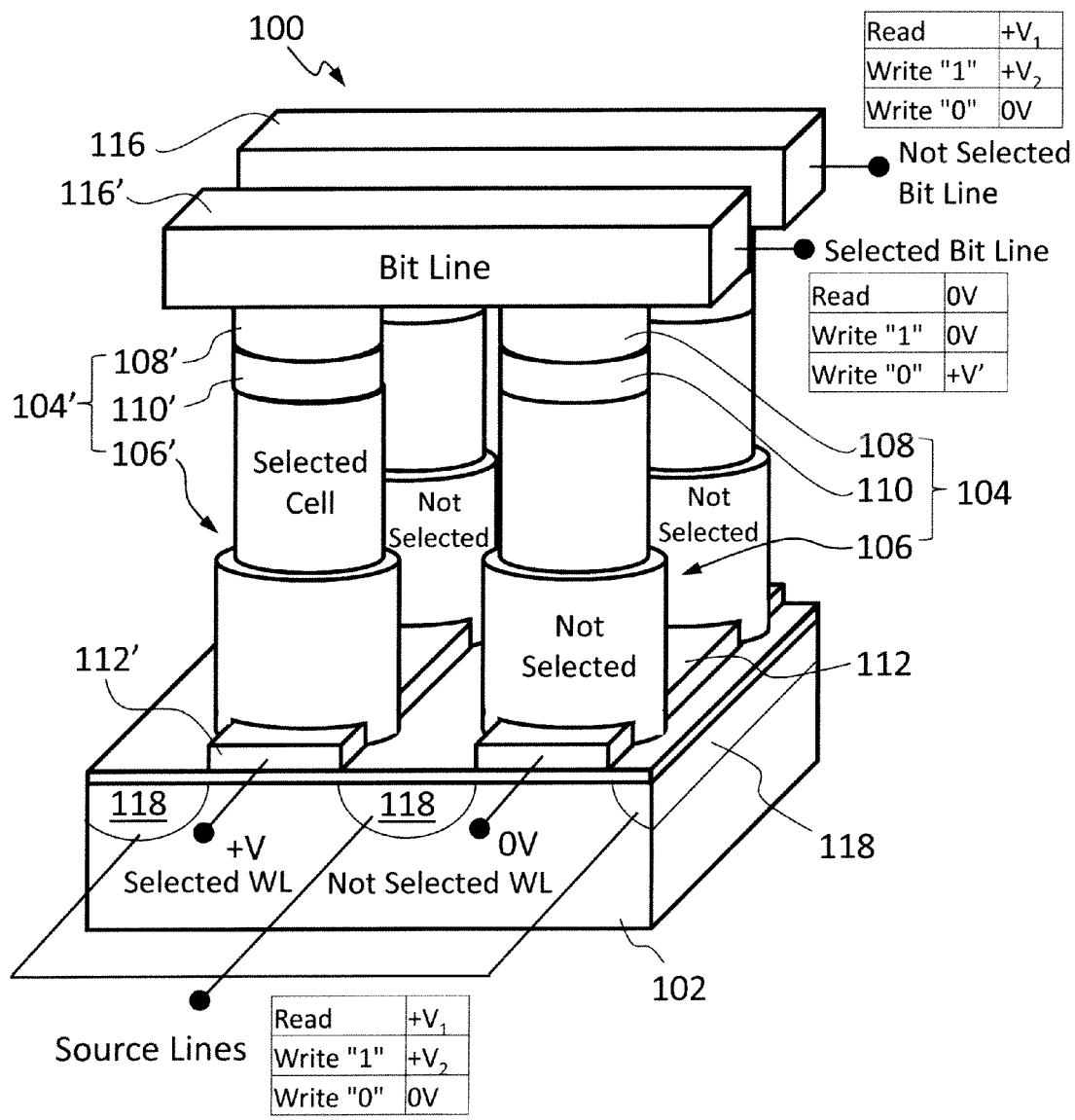
FIG. 4 is a perspective view illustrating the operation of a resistive memory device according to an embodiment of the present invention.

Operation of the resistive memory device 100 will now be described with reference to FIG. 4. In the drawing numerals 100 to 118 denote the same components or elements as those shown in FIG. 2. FIG. 4 illustrates an exemplary method of using the resistive memory device 100, which may operate in three different modes: read, write "0," or write "1." A selected memory cell 104' for read or write operation is situated at the cross point between a selected bit line 116' and a selected word line 112'. For read or write operations, a suitable positive voltage is applied to the selected word line 112', thereby forming conductive channels in vertical selection transistors connected thereto. The rest of the word lines 112 not selected are grounded or have a voltage below a threshold for creating conductive channels. For the read mode of operation, a positive voltage $V_1$ is applied to all source lines 118, while the selected bit line 116' is grounded. For the write "1" mode of operation, a positive voltage $V_2$, which is higher than $V_1$, is applied to all source lines 118, while the selected bit line 116' is grounded. For the write "0" mode of operation, all source lines 118 are grounded, while a positive voltage is applied to the selected bit line 116'. For all modes of operation, the bit lines 116 not selected have substantially same voltage settings as the source lines 118, thereby preventing current flowing through memory cells connected to unselected bit lines 116. The above described operating conditions ensure that only the selected memory cell 104' situated at the cross point between the selected bit line 116' and the selected word line 112' has current flowing therethrough in all modes of operation.

Figure 5:
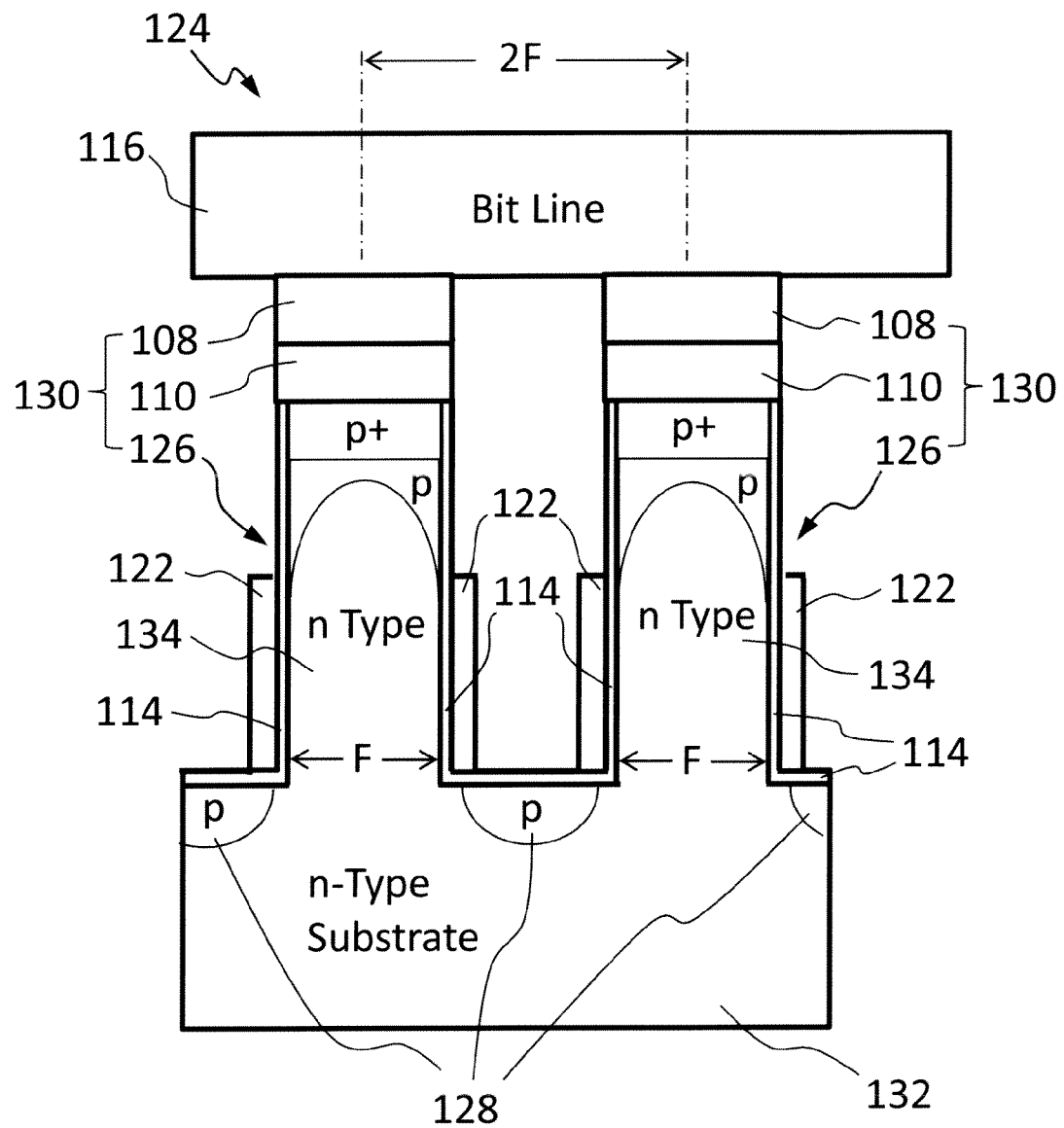
FIG. 5 is a cross sectional view of another embodiment of the present invention as applied to a resistive memory device having an array of p-type vertical selection transistors.

Another embodiment of the present invention as applied to a resistive memory device 124 comprising an array of vertical selection transistors 126 that have p-type conductive channels is illustrated in FIG. 5, which shows the cross sectional view of the device 124 along the direction of source lines 128. In the drawing numerals 108 to 122 denote the same components or elements as those shown in FIGS. 2 and 3. The resistive memory device 124 is different from the device 100 shown in FIGS. 2 and 3 in that the vertical selection transistors 126 in respective memory cells 130 have the p-type conductive channels. Accordingly, a semiconductor substrate 132 and lower regions of protruded semiconductors pillars 134 surrounded by the gate electrodes 122 have a n-type conductivity. Upper regions of the semiconductor pillars 134 not surrounded by the gate electrodes 122 have the p-type conductivity and function as drain. In some embodiments, the top of the drain regions adjacent to the contact studs 110 may be heavily doped (i.e. p+) to reduce electrical resistance. Correspondingly, parallel source lines 128 have the p-type conductivity and function as source. When a negative voltage is applied to the gate electrodes 122, p-type conductive channels are formed in the periphery regions of the pillars 134 surrounded by the electrodes 122, thereby permitting current to flow vertically through the transistors 126.

Figure 6:
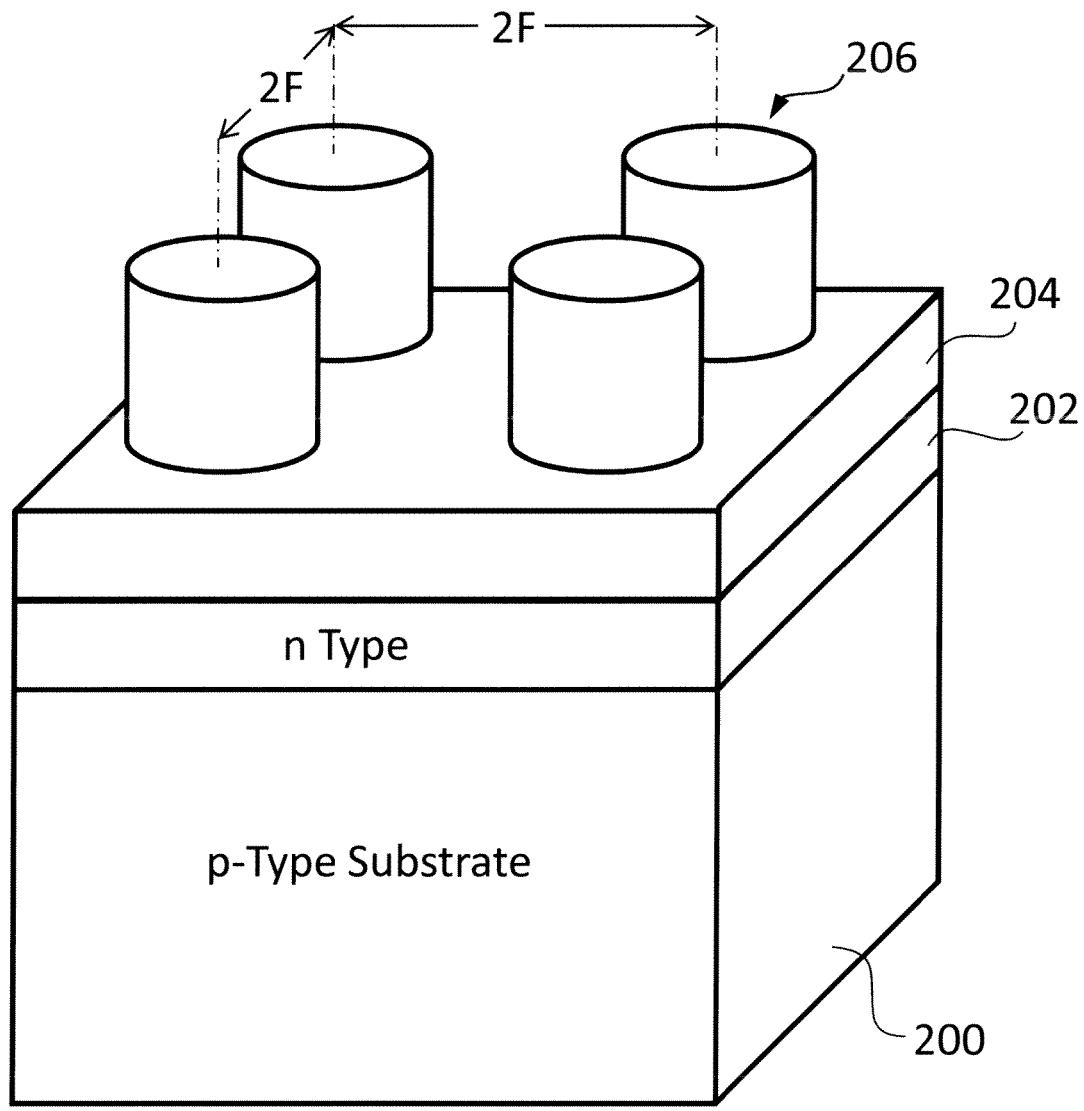
FIGS. 6-15 are perspective views illustrating various stages in formation of a resistive memory device according to embodiments of the present invention.

Fabrication of the resistive memory device will now be described with reference to FIGS. 6-15, which illustrate various intermediate structures of the memory device 100 shown in FIG. 2. Referring now to FIG. 6, the processing starts by providing a semiconductor substrate 200 having a first type conductivity. The substrate 200 can be any semiconductor substrate known in the art, such as Si, SiGe, SiC, SiCGe, II-VI compounds, III-V compounds, or semiconducting epitaxial layers over such substrates. In one embodiment, the semiconductor substrate 200 is formed of silicon. A doped layer 202 having a second type conductivity, opposite to the first type, is formed on top of the substrate 200 by ion implantation. In another embodiment, the first type conductivity provided in the substrate 200 is p type and the second type conductivity provided in the doped layer 202 is n type formed by ion implantation with any suitable dopant, such as phosphorous, arsenic, or antimony. A hard mask layer 204 is deposited on top of the doped layer 202 by any suitable deposition method, such as PVD, CVD, or ALD. The hard mask layer 204 may comprise one or more layers of any suitable hard mask material that has a low etch selectivity with respect to the substrate 200 therebeneath, including oxides, nitrides, oxynitrides, metals, or combinations thereof. In one embodiment, the hard mask layer 204 is formed of silicon nitride, aluminum oxide, or amorphous carbon. A plurality of features 206 comprising any suitable organic resist material are patterned on top of the hard mask layer 204 by photo lithography, e-beam lithography, or nanoimprint lithography. In one embodiment, the plurality of features 206 are arranged in a square array with a minimum pitch of 2F in both directions.

Figure 7:
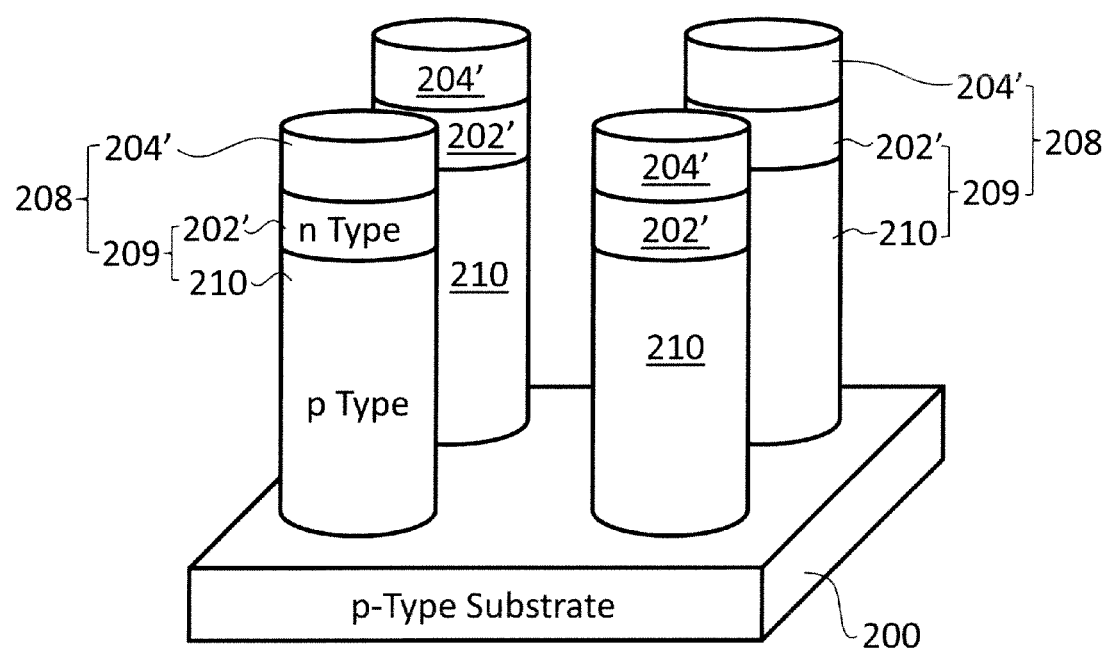

Referring to FIG. 7, the processing continues by transferring the pattern of the features 206 into the hard mask 204' by a vertical dry etching method such as Reactive Ion Etch (RIE). In some embodiments where the hard mask layer 204 is made of aluminum oxide, the vertical dry etching process may be carried out by using a RIE gas chemistry comprising chlorine and boron trichloride. The pattern of the hard mask 204' is further transferred into the substrate 200 by vertical dry etch to form a plurality of pillar structures 208 protruded therefrom. The pillar structures 208 include the hard mask 204' disposed on top of semiconductor pillars 209 protruded from the substrate 200. The semiconductor pillars 209 further comprise lower semiconductor pillars 210 having the first type conductivity and upper semiconductor pillars 202' having the second type conductivity, opposite to the first type conductivity. In some embodiments where the substrate 200 is made of silicon, the vertical dry etching process may be carried out using a RIE gas chemistry comprising hydrogen bromide (HBr) and chlorine ($Cl_2$).

Figure 8:
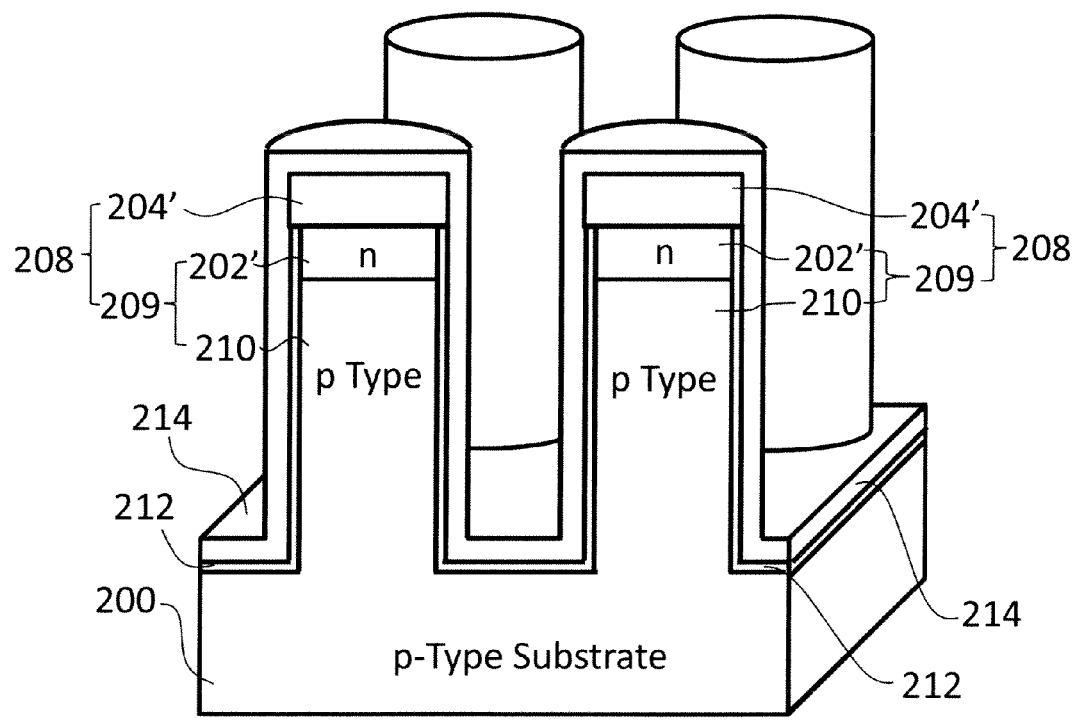

Referring to FIG. 8, a gate dielectric layer 212 is conformally deposited over outer surfaces of the pillar structures 210 and the substrate 200 by CVD or ALD. The gate dielectric layer 212 may comprise any material with sufficiently high dielectric constant, including but not limited to silicon oxide ($SiO_x$), silicon oxynitride ($SiO_xN_y$), hafnium oxide ($HfO_x$), hafnium oxynitride ($HfO_xN_y$), hafnium silicate ($HfSiO_x$), $HfSiO_xN_y$, zirconium oxide ($ZrO_x$), zirconium oxynitride ($ZrO_xN_y$), zirconium silicate ($ZrSiO_x$), $ZrSiO_xN_y$, aluminum oxide ($AlO_x$), or combinations thereof. In some embodiments where the substrate 200 is made of silicon, the gate dielectric layer 212 may be formed of silicon oxide by thermal oxidation of the outer surfaces of the substrate 200 and the semiconductor pillars 209. Following the formation of the gate dielectric layer 212, a conductor layer 214 is conformally deposited thereover by CVD or ALD. The conductor layer 214 may comprise one or more layers of any suitable conductive material, such as doped polysilicon, tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), or combinations thereof. In some embodiments where the substrate 200 is made of silicon, the conductor layer 214 may comprise a doped polysilicon layer deposited by CVD or ALD.

Figure 9:
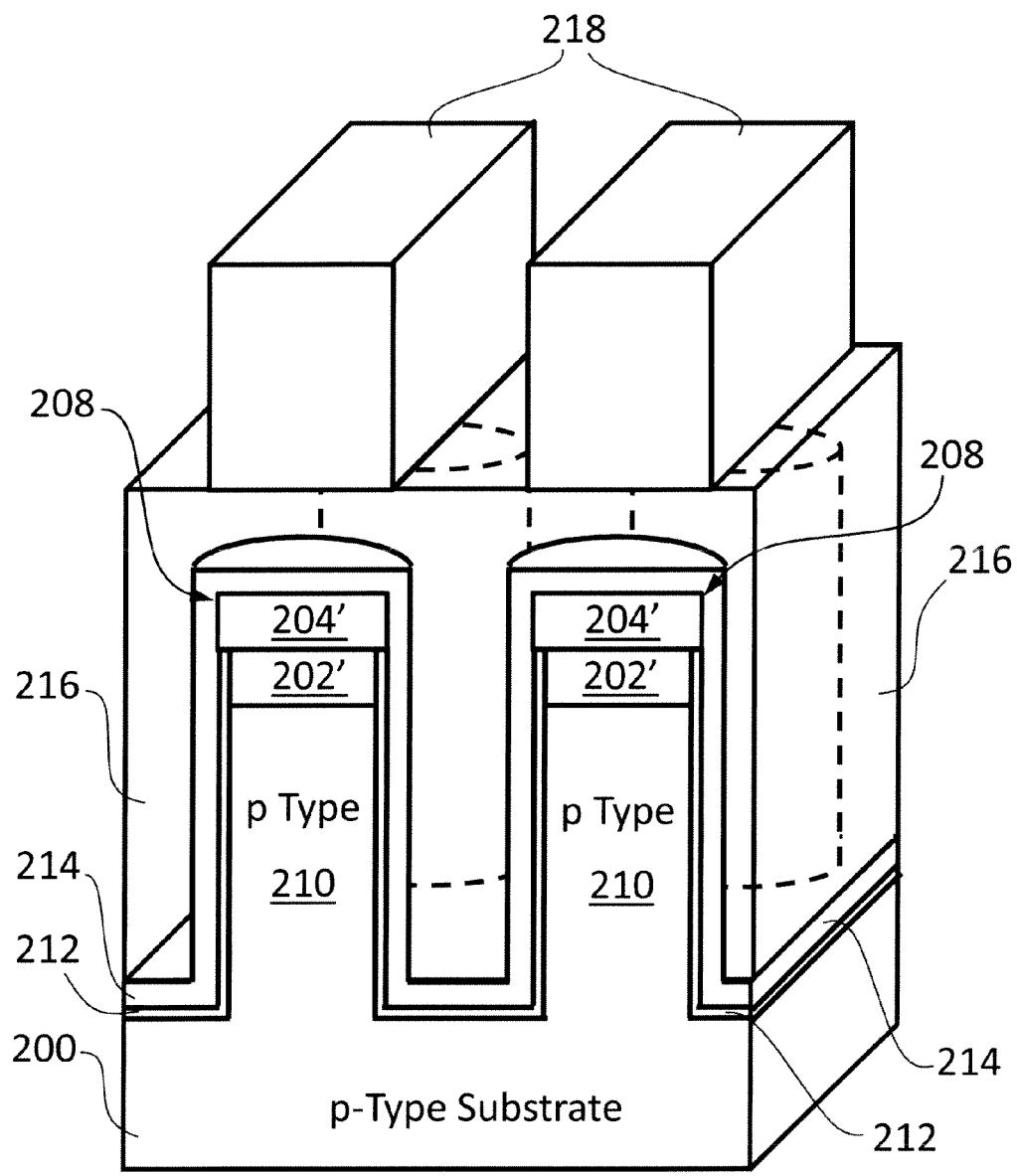

Following the deposition of the conductor layer 214, crevices in between the pillar structures 208 are filled with an organic Bottom Anti-Reflection Coating (BARC) layer 216 such that the top surface of the BARC layer 216 is substantially flat and is above the top of the pillar structures 208 as illustrated in FIG. 9. A plurality of parallel resist lines 218 extending along a first direction are formed on top of the BARC layer 216 by photolithography, e-beam lithography, or nanoimprint lithography for defining word lines. The parallel resist lines 218 are disposed above rows of the pillar structures 208 along the first direction. For a square array arrangement of the pillar structures 208, the first direction would correspond to any one of two directions which have a minimum pillar pitch.

Figure 10:
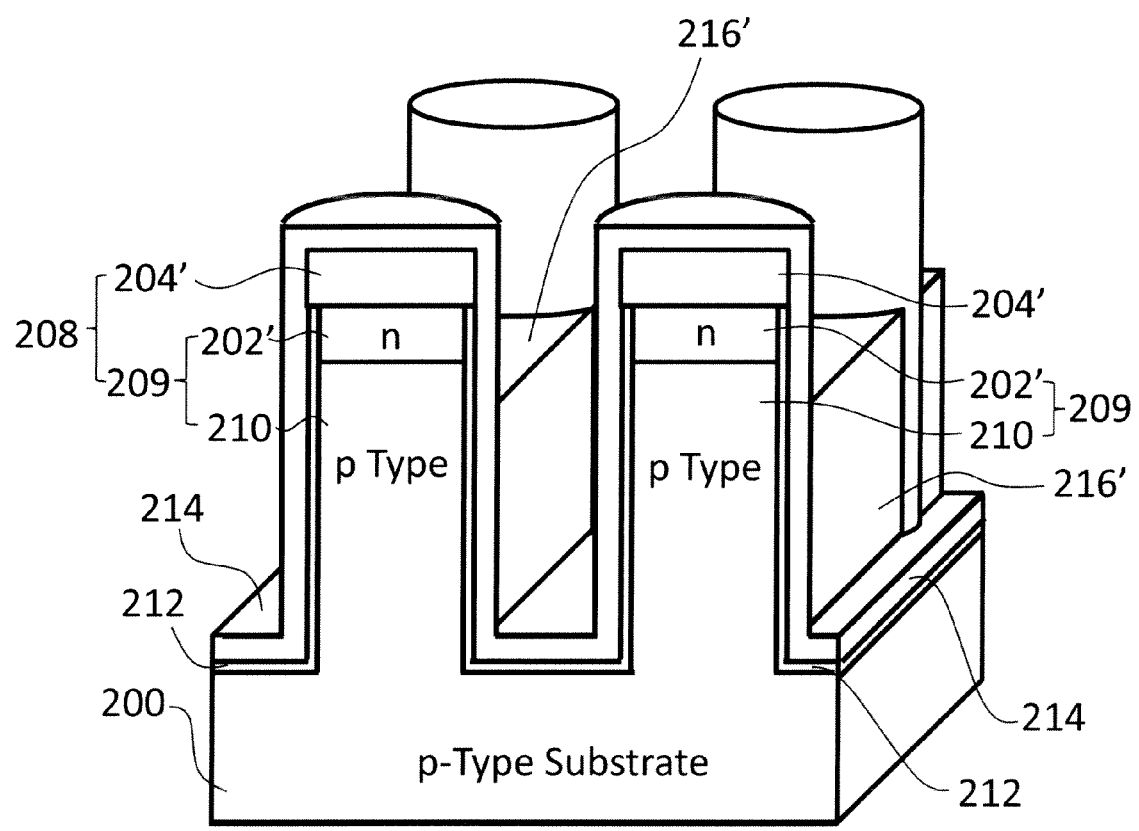

After the formation of the parallel resist lines 218, a vertical dry etching process is used to remove the BARC layer 216 in between the resist lines 218 and to transfer the resist pattern to form BARC mask 216', resulting in a structure illustrated in FIG. 10. The height of the BARC mask 216' is lower than that of the lower semiconductor pillars 210. The vertical dry etching process may be accomplished by using a conventional BARC etching process.

Figure 11:
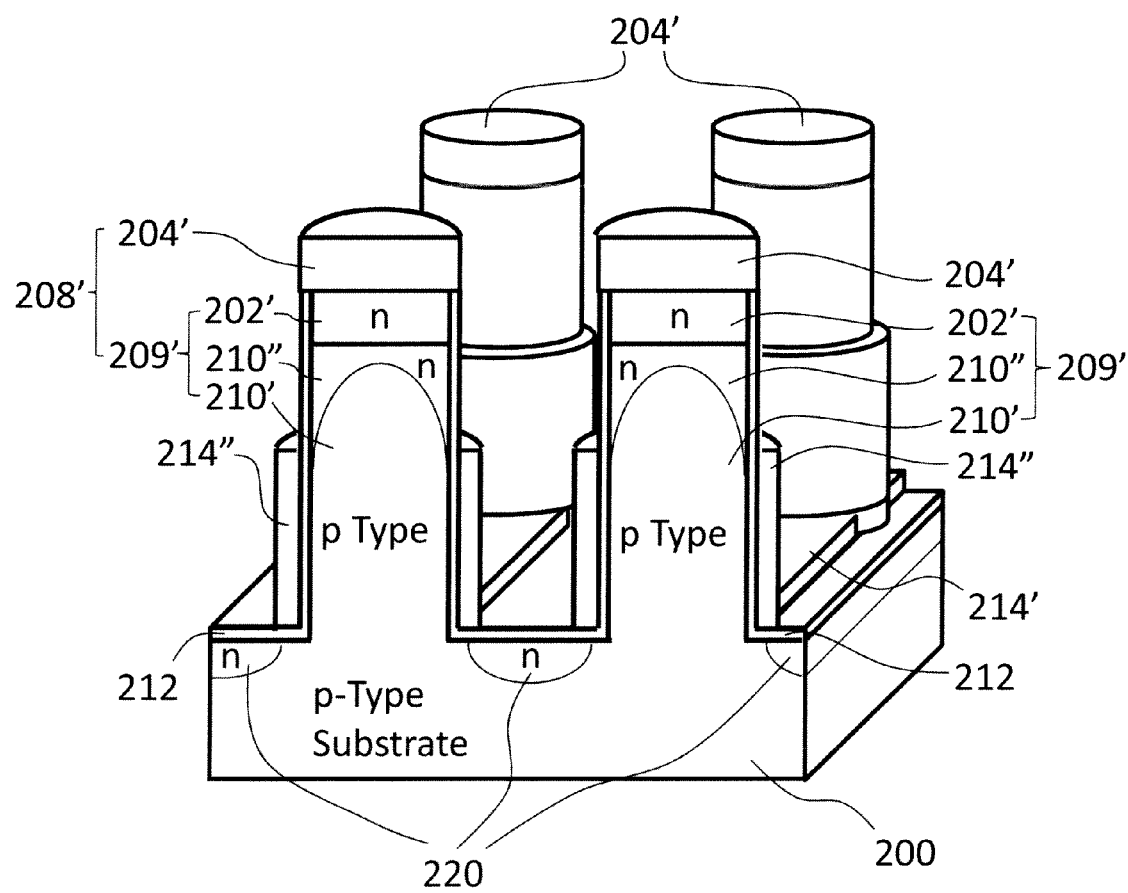

The processing continues by vertical dry etching of the conductor layer 214 to remove exposed areas not covered by the BARC mask 216', resulting in a structure illustrated in FIG. 11. Areas of the conductor layer 214 in between the pillar structures 208' not covered by the BARC mask 216' are removed to define a plurality of word lines 214' beneath the BARC mask 216'. The conductor layer 214 covering the pillar structures 208' is partially removed to form gate electrodes 214" in the same etching process. The vertical dry etching process is carried out until the height of the gate electrodes 214" is below the bottom of the upper semiconductor pillars 202'. Hence, each of the parallel word lines 214' and the respective gate electrodes 214" connected thereto have a monolithic structure formed by the dry etching of the conductor layer 214. The word lines 214' extend and connect rows of the gate electrodes 214" along the first direction provided in the resist lines 218. In some embodiments where the conductor layer 214 comprises doped polysilicon, the vertical dry etching process may be accomplished by using a RIE chemistry comprising hydrogen bromide (HBr) and chlorine ($Cl_2$). The present approach of forming the gate electrodes 214" and the word lines 214' from a monolithic film by a self-aligned process and subsequent etch enables the memory cells to retain a minimum cell size of $4F^2$.

Following the formation of the word lines 214' and the gate electrodes 214", angled ion implantation with a suitable dopant having the second type conductivity is used to form parallel source lines 220 in top regions of the substrate 200 in between the word lines 214' and to form Lightly Doped Drain (LDD) regions 210" in top regions of the lower semiconductor pillars 210 not surrounded by the gate electrodes 214". The source lines 220 and the LDD regions 210", having the second type conductivity, form source and drain, respectively. In some embodiments where the second type conductivity is n type, the angled ion implantation may be carried out using any suitable dopant, such as phosphorous, arsenic, or antimony.

Figure 12:
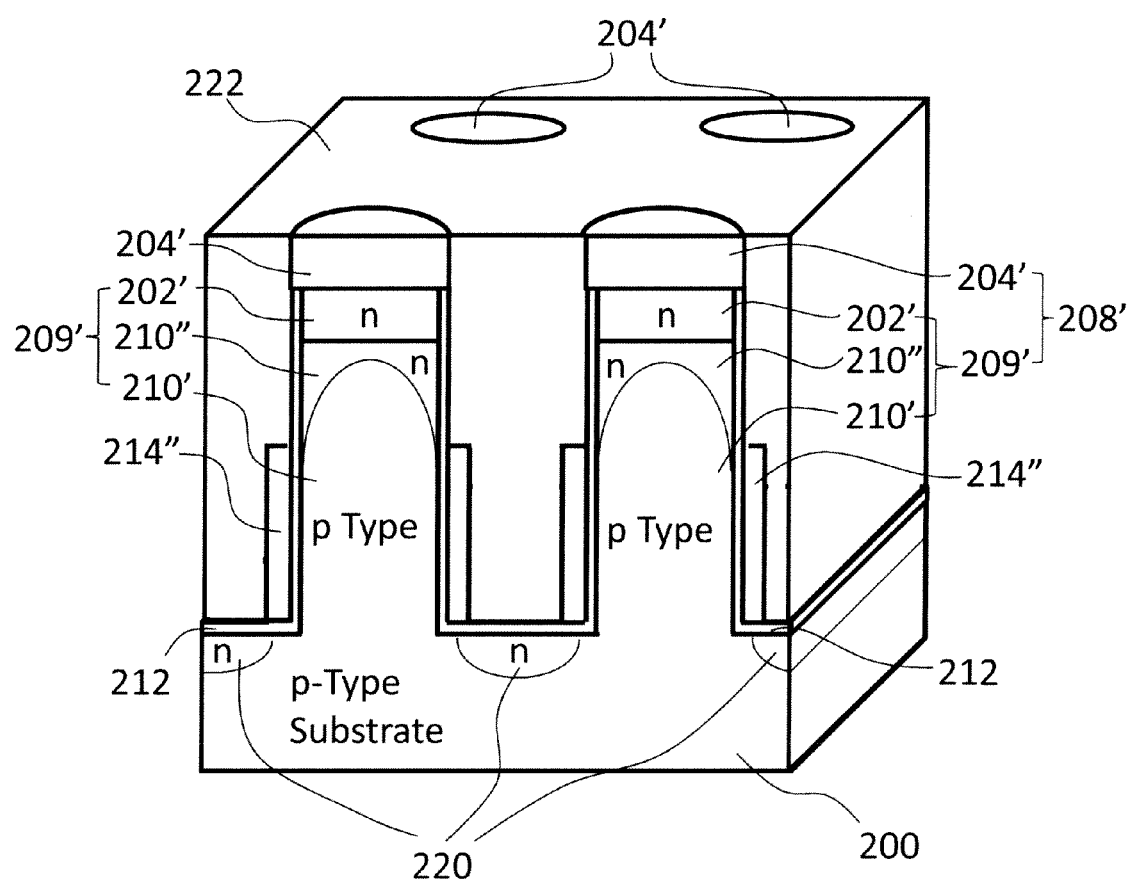

The processing continues by first depositing an interlayer dielectric (ILD) layer that completely fills crevices in between the pillar structures 208'. Excess ILD material above the pillar structures 208' is then removed by Chemical Mechanical Polishing (CMP) until the hard mask 204' is exposed, resulting in the pillar structures 208' imbedded in an ILD insulator 222 as shown in FIG. 12. The ILD insulator 222 may comprise any suitable dielectric material, such as silicon oxide, Spin-On Glass (SOG), or any insulating material with a sufficiently low dielectric constant.

Figure 13:
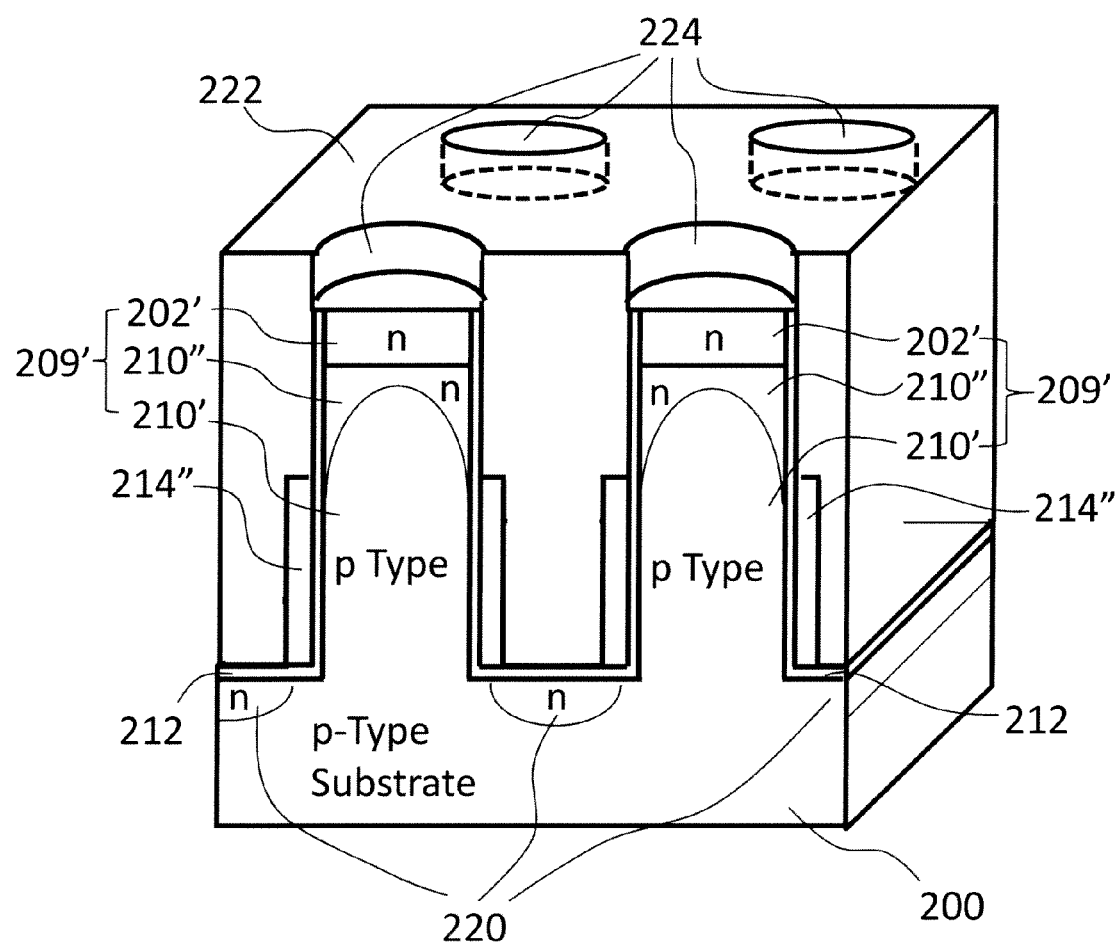

Referring to FIG. 13, the exposed hard mask 204' on top surface of the ILD insulator 222 is removed, leaving behind a plurality of contact holes 224 on the insulator surface. In some embodiments where the hard mask 204' comprises silicon nitride, the hard mask 204' may be removed by wet etching with hot phosphoric acids. In other embodiments where the hard mask 204' comprises aluminum oxide, the hard mask 204' may be removed by wet etching with a basic solution such as potassium hydroxide. Following the removal of the hard mask 204', additional ion implantation may be carried out to implant any suitable dopant having the second type conductivity into the upper semiconductor pillars 202' and the LDD regions 210".

Figure 14:
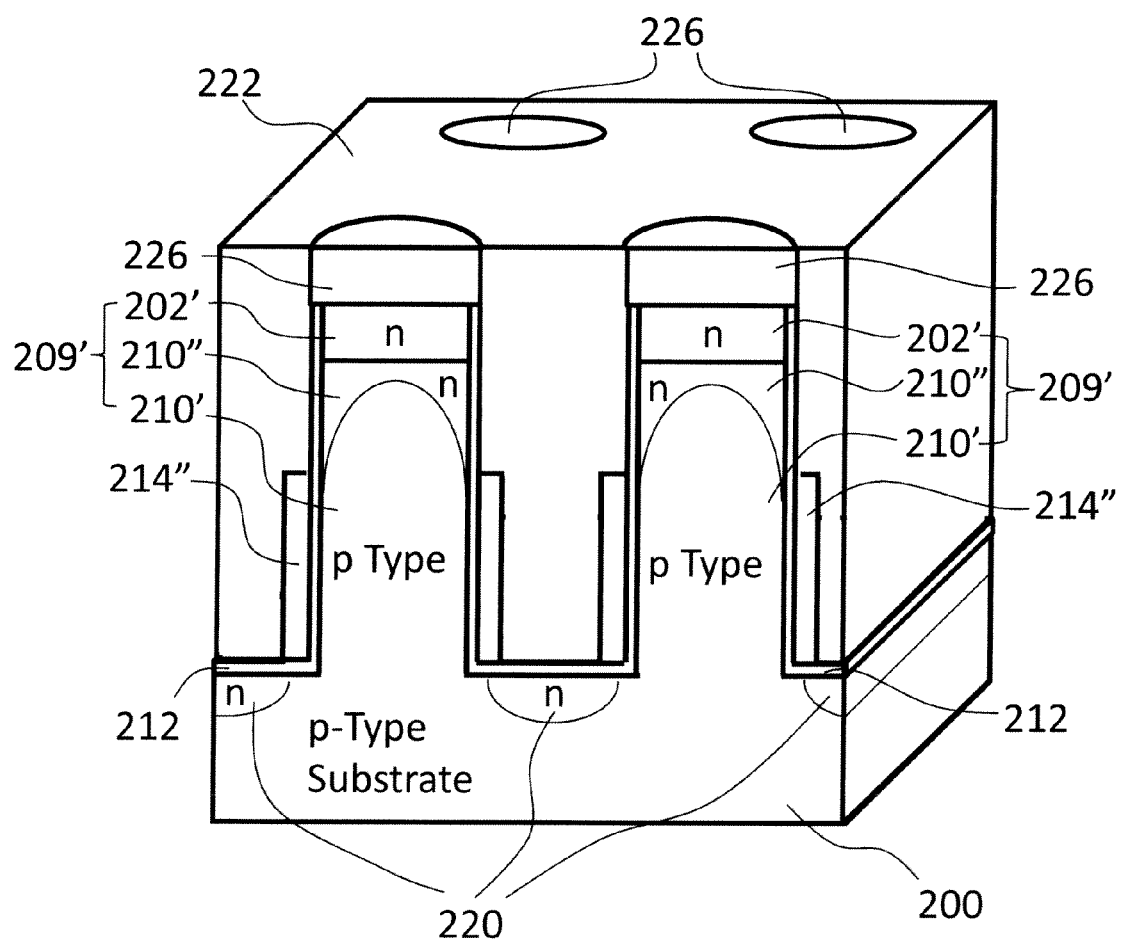

Referring to FIG. 14, the processing continues by filling the contact holes 224 exposed on the top surface of the ILD insulator 222 with at least a layer of conducting material to form a plurality of contact studs 226. This can be accomplished by first depositing and filling the contact holes 224 with at least a layer of any suitable conductor, such as tungsten (W), tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), or combinations thereof. Excess deposited conductor material above the top surface of the ILD insulator 222 is then removed by CMP to form the contact studs 226, which are in contact with the upper semiconductor pillars 202' therebeneath.

It should be noted that conventional process of forming contact studs requires first printing a resist layer with holes that are aligned to transistor structures underneath to form contact holes. As the feature size shrinks to dimensions of a few tens of nanometer, however, proper alignment between the holes in the resist layer and the structures therebeneath becomes increasingly difficult. The present process of filling the contact holes 224 left behind from the removal of the hard mask 204" with a conducting material enables the contact studs 226 to self-align to the upper semiconductor pillars 202' therebeneath, thereby advantageously avoiding the above mentioned problem.

Figure 15:
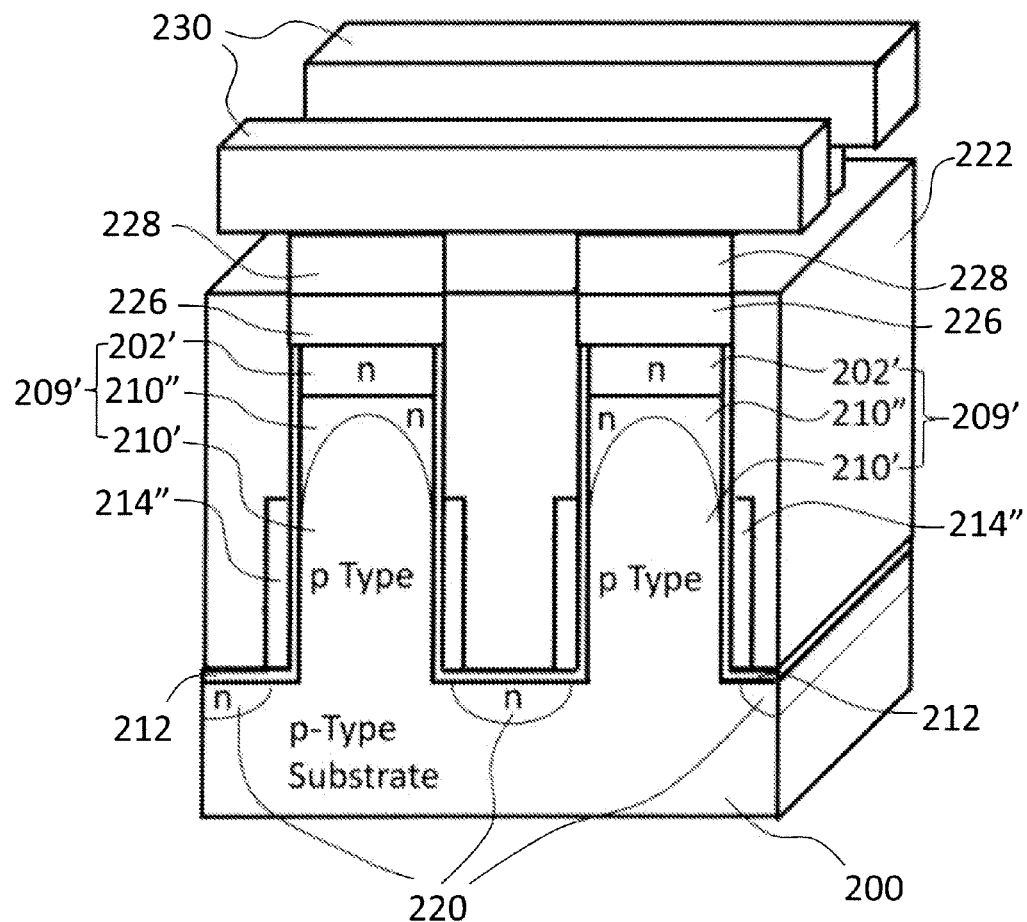

Following the formation of the contact studs 226, a plurality of resistive memory elements 228 are formed thereabove as illustrated in FIG. 15. The resistive memory elements 228 may be formed by first depositing one or more layers of functional films onto the top surface of the ILD insulator 222 and then followed by printing resist features on top the functional films that are aligned to the contact studs 226. The resist features are transferred to the functional films by any suitable pattern transfer process, such as RIE or ion milling, thereby forming the resistive memory elements 228. A hard mask layer may interposed between the functional films and the resist features to facilitate the pattern transfer process. In one embodiment, the functional films for the resistive memory elements 228 comprise a phase change chalcogenide compound film, such as $Ge_2Sb_2Te_5$ or AgInSbTe, which can switch between a resistive amorphous phase and a conductive crystalline phase. In another embodiment, the functional films for the resistive memory elements 228 comprise a nominally insulating metal oxide film, such as NiO, $TiO_2$, or $Sr(Zr)TiO_3$, which can switch to a lower electrical resistance state as the metal rich precipitates grow and link to form conductive paths upon application of an appropriate voltage. In yet another embodiment, the functional films for the resistive memory elements 228 comprise at least two layers of ferromagnetic materials and a non-magnetic spacer layer interposed therebetween.

With continuing reference to FIG. 15, a plurality of parallel bit lines 230 are formed on top of the resistive memory elements 228 and connect rows of the resistive elements 228 along a second direction that is different from the first direction of the source lines 220. In one embodiment where the memory cells are arranged in a square array, the second direction of the bit lines 230 would correspond to a direction substantially perpendicular to the first direction. The bit lines 230 may be formed by first filling crevices in between the resistive memory elements 228 with an insulator and followed by removing excess insulator material on top of resistive memory elements 228 by CMP. A wiring conductor layer is deposited onto planarized surfaces of the insulator (not shown) and the resistive memory elements 228 embedded therein. Parallel resist lines, which are aligned to rows of the resistive memory elements 228 along the second direction, are printed on top of the wiring conductor layer. The resist line pattern is then transferred to the wiring conductor layer by any suitable pattern transfer process, such as RIE or ion milling, thereby forming the parallel bit lines 230 connecting rows of the resistive memory elements 228. Alternatively, the bit lines 230 may be formed by a Damascene process on top of the resistive memory elements 226 in a manner as well known to one of skill in the art. The bit lines 230 may comprise any suitable conductive material, such as copper (Cu), tungsten (W), aluminum (Al), silver (Ag), or alloys thereof.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A resistive memory device comprising:
   a semiconductor substrate having a first type conductivity;
   a plurality of vertical selection transistors formed on said semiconductor substrate in an array, each of said plurality of vertical selection transistors including:
      a semiconductor pillar protruded from said semiconductor substrate, top region of said semiconductor pillar having a second type conductivity opposite to the first type conductivity provided in said semiconductor substrate; and
      a gate electrode surrounding said semiconductor pillar with a gate dielectric layer interposed therebetween, said gate electrode being lower in height than said semiconductor pillar;
   a plurality of contact studs with each contact stud being self-aligned to the top region one of the semiconductor pillars and providing Ohmic contact for one of said vertical selection transistors;
   a plurality of resistive memory elements with each resistive memory element disposed on top of one of said contact studs, said plurality of resistive memory elements being arranged in a square array with a pitch of 2F, where F is a minimum lithography feature size for the resistive memory device;
   a plurality of parallel word lines with each word line connecting a row of gate electrodes of said vertical selection transistors, said parallel word lines extending along a first direction and being monolithic with said row of gate electrodes;
   a plurality of parallel bit lines respectively connecting rows of said resistive memory elements, said parallel bit lines extending along a second direction different from the first direction provided in said parallel word lines; and
   a plurality of parallel source lines with the second type conductivity formed in top regions of said semiconductor substrate with each source line being disposed parallel to and in between word lines connecting adjacent rows of said vertical selection transistors, wherein a pair of said source lines function as common source for adjacent rows of said vertical selection transistors.

2. The resistive memory device according to claim 1, wherein said vertical selection transistors are arranged in a square array with a pitch of 2F in the first and second directions and each resistive memory element having a size of $4F^2$.

3. The resistive memory device according to claim 1, wherein each of said word lines and said row of gate electrodes connected thereto have a monolithic structure and wherein the gate electrodes surround a lower portion of the pillars and the word lines are disposed on the substrate in between the pillars.

4. The resistive memory device according to claim 1, wherein said semiconductor substrate comprises silicon.

5. The resistive memory device according to claim 1, wherein the first type and second type conductivities are p type and n type conductivities, respectively.

6. The resistive memory device according to claim 1, wherein said gate dielectric layer comprises silicon oxide.

7. The resistive memory device according to claim 1, wherein said gate dielectric layer is formed of a compound comprising hafnium and oxygen.

8. The resistive memory device according to claim 1, wherein said gate electrodes and said word lines connected thereto comprise doped polysilicon.

9. The resistive memory device according to claim 1, wherein said gate electrodes and said word lines connected thereto comprise at least one layer formed of titanium nitride.

10. The resistive memory device according to claim 1, wherein said contact studs are made of a conducting material comprising tungsten.

11. The resistive memory device according to claim 1, wherein said resistive memory elements comprise a phase change chalcogenide compound such as $Ge_2Sb_2Te_5$ or AgInSbTe.

12. The resistive memory device according to claim 1, wherein said resistive memory elements comprise a precipitate bridging metal oxide such as, $NiO$, $TiO_2$, $Sr(Zr)TiO_3$, or combinations thereof.

13. The resistive memory device according to claim 1, wherein said resistive memory elements comprise at least two layers of ferromagnetic materials with a layer of non-magnetic spacer interposed therebetween.

14. A resistive memory device comprising:
    a silicon substrate having a first type conductivity;
    a plurality of vertical selection transistors formed on said silicon substrate in an array, each of said plurality of vertical selection transistors including:
       a silicon pillar protruded from said silicon substrate, top region of said silicon pillar having a second type conductivity opposite to the first type conductivity provided in said silicon substrate; and
       a doped polysilicon gate electrode surrounding said silicon pillar with a silicon oxide gate dielectric layer interposed therebetween, said doped polysilicon gate electrode being lower in height than said silicon pillar;
    a plurality of contact studs with each contact stud being self-aligned to the top region one of the semiconductor pillars and providing Ohmic contact for one of said vertical selection transistors;
    a plurality of resistive memory elements disposed on top of said contact studs;
    a plurality of parallel word lines with each word line connecting a row of gate electrodes of said vertical selection transistors, said parallel word lines extending along a first direction and being monolithic with the gate electrodes;

a plurality of parallel bit lines respectively connecting rows of said resistive memory elements, said parallel bit lines extending along a second direction different from the first direction provided in said parallel word lines; and a plurality of parallel source lines with the second type conductivity formed in top regions of said semiconductor substrate with each source line being disposed parallel to and in between word lines connecting adjacent rows of said vertical selection transistors, wherein said vertical selection transistors are arranged in a square array with a pitch of 2F, each of said word lines and said row of gate electrodes connected thereto have a monolithic structure, and a pair of said source lines function as common source for adjacent rows of rows of said vertical selection transistors.

15. The resistive memory device according to claim 14, wherein the first type and second type conductivities are p type and n type conductivities, respectively.

16. The resistive memory device according to claim 14, wherein the first type and second type conductivities are n type and p type conductivities, respectively.

17. The resistive memory device according to claim 14, wherein said resistive memory elements comprise a phase change chalcogenide compound such as $Ge_2Sb_2Te_5$ or AgInSbTe.

18. The resistive memory device according to claim 14, wherein said resistive memory elements comprise a precipitate bridging metal oxide such as NiO, $TiO_2$, $Sr(Zr)TiO_3$, or combinations thereof.

19. The resistive memory device according to claim 14, wherein said resistive memory elements comprise at least two layers of ferromagnetic materials with a layer of non-magnetic spacer interposed therebetween.

20. A method for fabricating a resistive memory device comprising the steps of:

providing a semiconductor substrate having a first type conductivity;

forming a plurality of semiconductor pillars on said substrate with top regions of said pillars having a second type conductivity opposite to the first type conductivity;

depositing a conformal gate dielectric layer over the substrate and around peripheries of said semiconductor pillars;

depositing a conformal layer of conductive material over the gate dielectric layer and around the peripheries of said semiconductor pillars;

selectively dry etching the layer of conductive material to remove the conductive material from tops of said semiconductor pillars and from parallel strips between said semiconductor pillars to form a plurality of self-aligned gate electrodes around said semiconductor pillars with said gate dielectric layer interposed therebetween and to form a plurality of parallel word lines connecting said gate electrodes that are monolithic with said gate electrodes, said gate electrodes being lower in height than said semiconductor pillars;

forming a plurality of parallel source lines in top regions of said substrate in between and parallel to said word lines by ion implantation, said source lines having the second type conductivity and thereby forming source lines that are common to adjacent word lines;

forming a plurality of self-aligned contact studs on said semiconductor pillars;

forming a plurality of resistive memory elements on said contact studs; and forming a plurality of parallel bit lines extending perpendicular to the source lines and connecting rows of said resistive memory elements.

21. The method according to claim 20, wherein said semiconductor substrate comprises silicon.

22. The method according to claim 20, wherein said semiconductor pillars are formed of silicon and said gate dielectric layer is formed of silicon oxide.

23. The method according to claim 22, wherein the step of forming said silicon oxide gate dielectric layer around peripheries of said silicon pillars is carried out by thermal oxidation of said silicon pillars.

* * * * *